United States Patent
Lent et al.

(10) Patent No.: US 6,995,369 B1
(45) Date of Patent: Feb. 7, 2006

(54) SCANNING ELECTRON BEAM APPARATUS AND METHODS OF PROCESSING DATA FROM SAME

(75) Inventors: Matthew Lent, Livermore, CA (US); Amir Azordegan, Santa Clara, CA (US); Hedong Yang, Santa Clara, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 0 days.

(21) Appl. No.: 10/876,833

(22) Filed: Jun. 24, 2004

(51) Int. Cl.
*H01J 37/28* (2006.01)

(52) U.S. Cl. .................. 250/307; 250/310; 250/311

(58) Field of Classification Search .............. 250/307, 250/310, 311
See application file for complete search history.

(56) References Cited

U.S. PATENT DOCUMENTS

| | | |
|---|---|---|
| 5,869,833 A | 2/1999 | Richardson et al. |
| 6,797,955 B1 * | 9/2004 | Adler et al. ............. 250/310 |
| 6,853,204 B2 * | 2/2005 | Nishiyama et al. ......... 324/751 |

* cited by examiner

*Primary Examiner*—John R. Lee
*Assistant Examiner*—Jennifer Yantomo
(74) *Attorney, Agent, or Firm*—Okamoto & Benedicto LLP (57) ABSTRACT

One embodiment disclosed relates to a scanning electron beam apparatus. The apparatus includes an electron beam column, a scanning system, and a detection system. Circuitry in the apparatus is configured to store detected pixel data from each scan into one of the multiple frame buffers. A multi-frame data processor is configured to analyze the pixel data available in the multiple frame buffers. Another embodiment disclosed relates to a scanning electron beam apparatus having a data processor is configured to process the image data with a filter function having a filter strength, store results of the processing, and repeat the processing and the storing using various filter strengths. The results of the processing may comprise a critical dimension measurement at each filter strength.

18 Claims, 11 Drawing Sheets

FIG. 3
(Conventional)

SCANNING ELECTRON BEAM APPARATUS AND METHODS OF PROCESSING DATA FROM SAME

BACKGROUND OF THE INVENTION

1. Field of the Invention

The present invention relates generally to electron beam apparatus and methods of using same.

2. Description of the Background Art

In scanning electron microscopy, a beam of electrons is scanned over a specimen, and the resulting electrons that are returned from the specimen surface are used to create an image of the specimen surface. In a typical system, the beam makes multiple scan passes over a specific area and pixel data from the multiple scans are accumulated or integrated (in effect, added together per pixel) to reduce noise in the resultant image.

SUMMARY

One embodiment of the invention pertains to a scanning electron beam apparatus. The apparatus includes an electron beam column, a scanning system, and a detection system. Circuitry in the apparatus is configured to store detected pixel data from each scan into one of the multiple frame buffers. A multi-frame data processor is configured to analyze the pixel data available in the multiple frame buffers.

Another embodiment disclosed relates to a scanning electron beam apparatus having a data processor configured to process the image data with a filter function having a filter strength, store results of the processing, and repeat the processing and the storing using various filter strengths. The results of the processing may comprise a critical dimension measurement at each filter strength.

DETAILED DESCRIPTION

Figure 1:
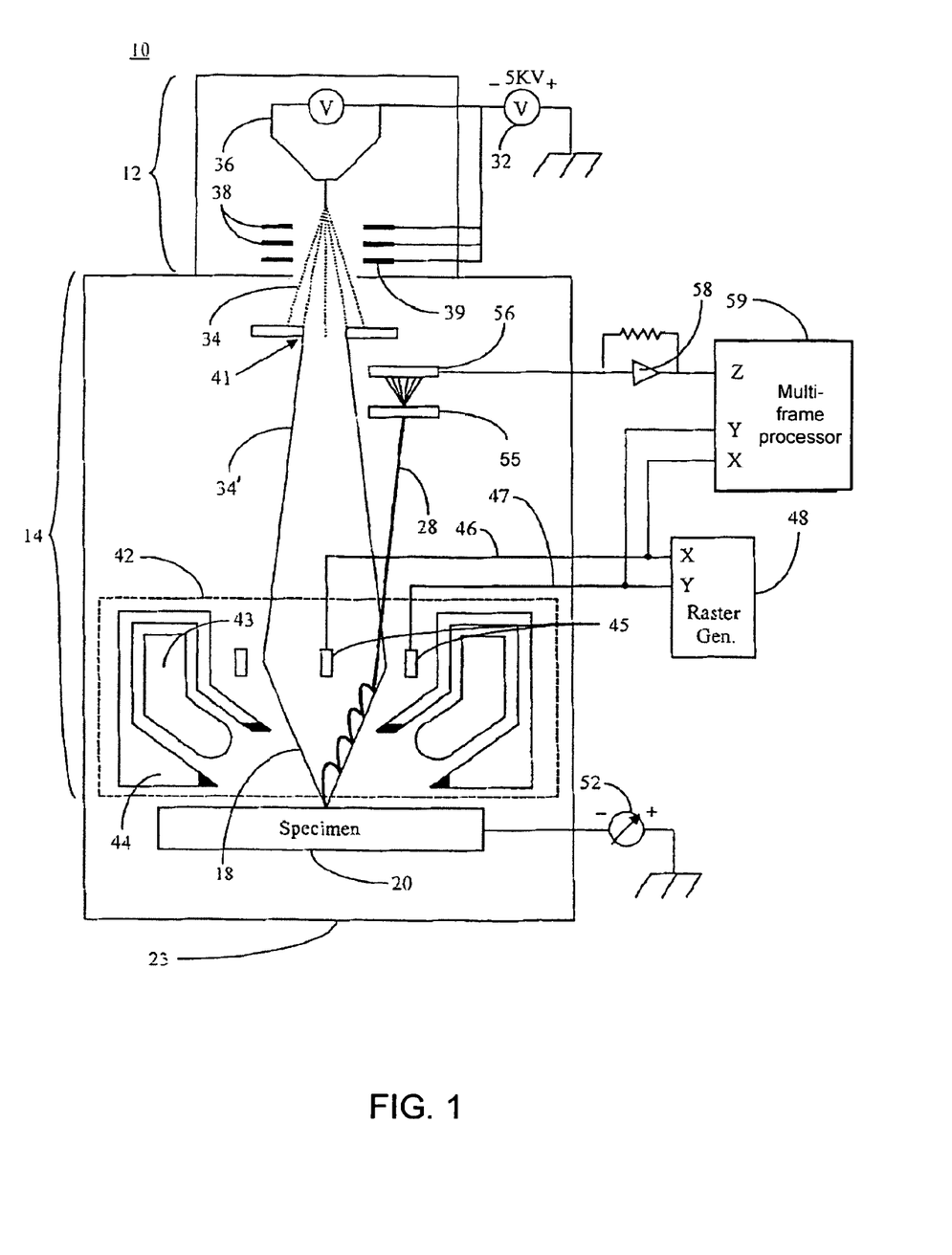
FIG. 1 is a schematic diagram of a scanning electron beam apparatus in accordance with an embodiment of the invention.

FIG. 1 is a schematic diagram (cross-sectional view) of a scanning electron beam apparatus 10 in accordance with an embodiment of the invention. As shown in FIG. 1, an electron beam source 12 at the top of a column produces an electron beam 34. One implementation that could be used includes an electron gun 36 that consists of a thermal field emitter (TFE) with the electrons accelerated by a surface field generated by power supply 32. Alternative electron gun embodiments could be employed. The electrons emitted by electron gun 36 are then, within beam source 12, directed through electrodes 38 and gun lens 39 (each also controlled by power supply 32) to form electron beam 34 that enters focusing column and lens assembly 14 to be directed to specimen 20.

In focusing column and lens assembly 14, the electron beam 34 may pass through an aperture 41 that limits the beam current and forms what is labeled electron beam 34' in FIG. 1. Electron beam 34' then passes through objective lens 42, including magnetic coils 43 and pole pieces 44, that generate a strong magnetic field. That magnetic field is used to focus beam 34' to form electron beam 18 with a small spot size directed at the specimen 20. Additionally, the location of electron beam 18 is controlled with scan plates 45, located within the magnetic field created by coils 43 and pole pieces 44. The scan plates 45 are powered by raster generator 48 to direct beam 18 in both the x and y directions across specimen 20 by signals on lines 46 and 47, respectively.

As the beam 34' passes through the magnetic field of objective lens 42 and the scan plates 45, it is focused into beam 18 and directed onto specimen 20. The specimen 20 is typically biased to a selected potential by a second power supply 52 to create a decelerating field for the primary electrons of beam 18 as they approach specimen 20. The result is that the "landing energy" of those electrons as they reach specimen 20 may be much lower than the energy with which they are provided by electron gun 36 and with which they travel through column and lens assembly 14.

Secondary and backscatter (together "scattered") electrons 28 are released as a result of the interaction of electron beam 18 with specimen 20 and are directed back toward lens 42. As the scattered electrons 28 are released, they spiral through lens 42 as a result of the magnetic field, and then travel toward a detector 55 as they leave the field within lens 42. The electron signal received by detector 55 is then collected by collector plate 56 which in-turn generates a signal that may be amplified by an amplifier 58 before being provided to a multiple-frame processor 59. Other input signals to the multi-frame processor 59 include signals x and y from raster generator 48 on lines 46 and 47, respectively. Additionally, electron beam source 12, focusing column and lens assembly 14, and specimen 20 are all contained within a vacuum chamber 23.

Figure 2:
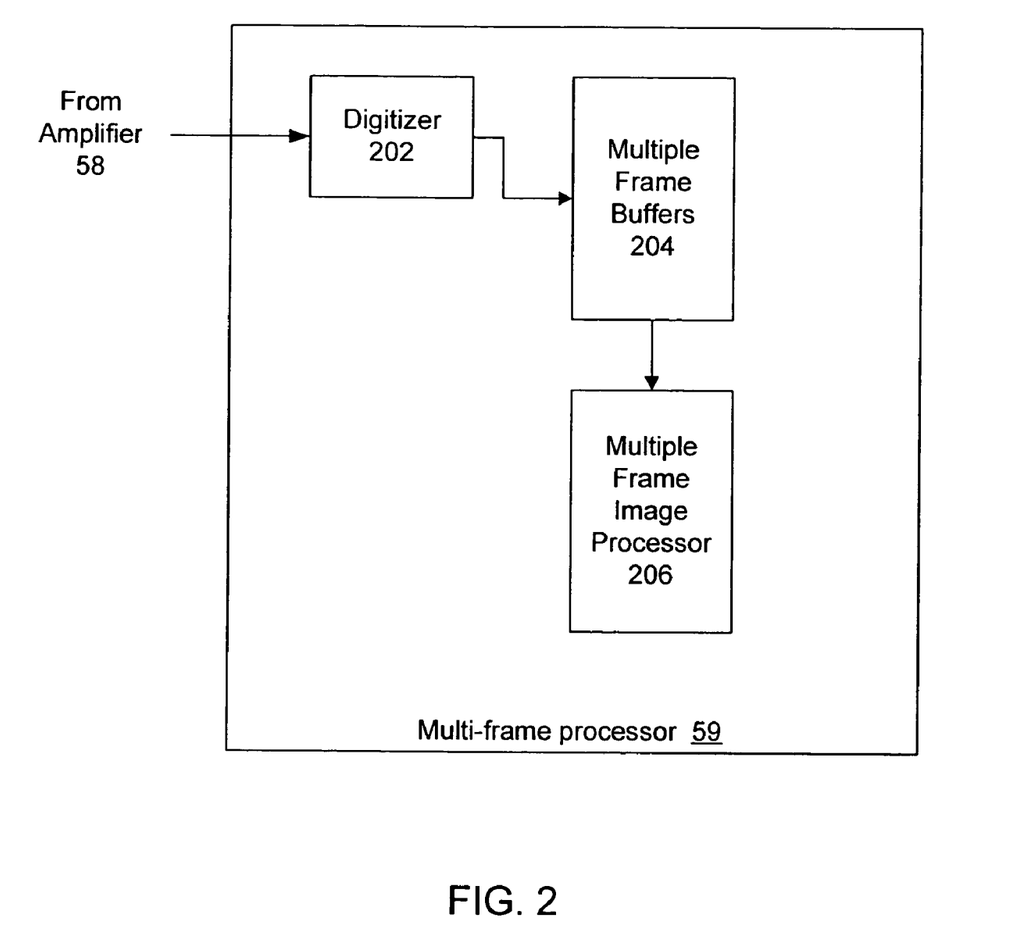
FIG. 2 is a schematic diagram of a multi-frame processor of a scanning electron beam apparatus in accordance with an embodiment of the invention.

FIG. 2 is a schematic diagram of a multi-frame processor 59 of a scanning electron beam apparatus 10 in accordance with an embodiment of the invention. An amplified detected signal is received from the amplifier 58 to a digitizer 202. The digitizer 202 converts the analog signal to digitized pixel data. Each frame of the digitized pixel data is provided to and stored in one of the multiple frame buffers 204. The data in the multiple frame buffers 204 are accessible by the multiple frame image processor 206. The multiple frame image processor 206 processes and analyzes the multiple frame data as described further below in relation to FIGS. 4 through 7.

Figure 3:
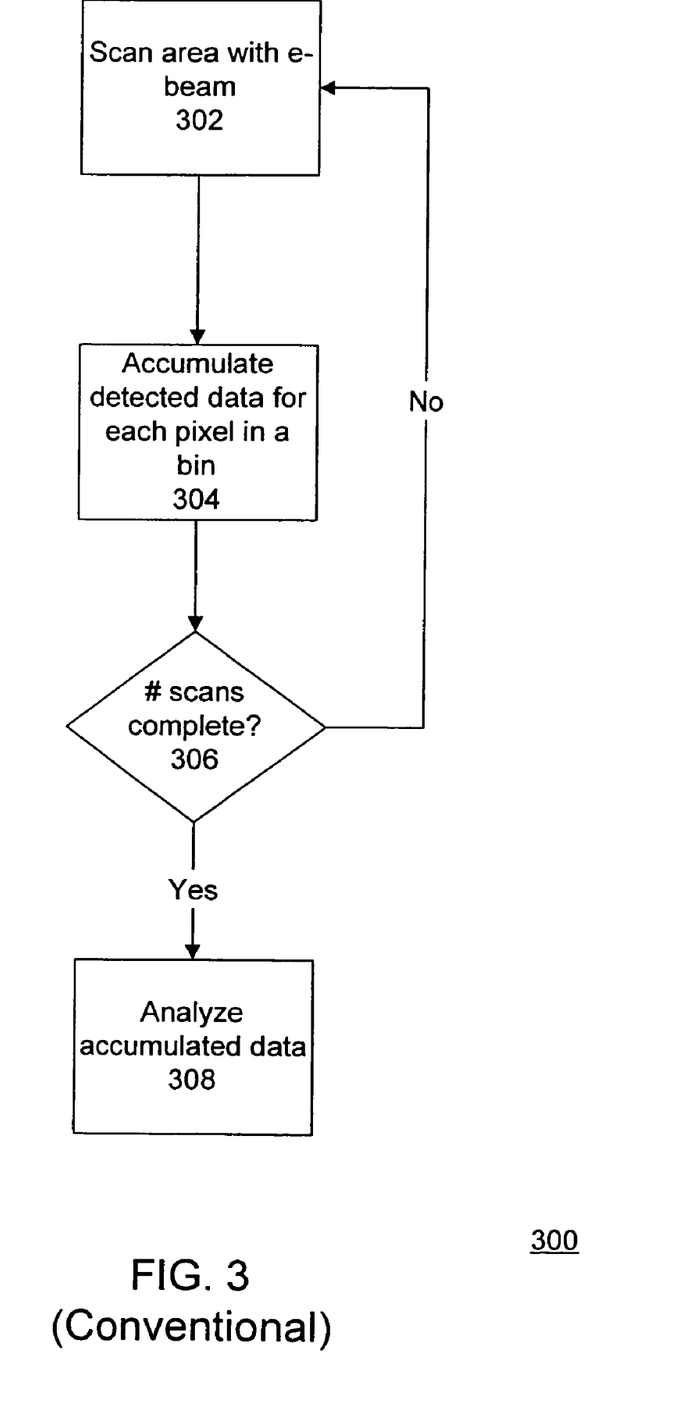
FIG. 3 is a flow chart depicting a conventional method of operation for a scanning electron microscope.

FIG. 3 is a flow chart depicting a conventional method 300 of operation for a scanning electron microscope. In this method 300, an area being imaged or analyzed is scanned 302 with an electron beam. Data from detected secondary and/or backscattered electrons for each pixel in the area is accumulated 304 in a single data "bin". A set of such bins forms a single frame buffer, with one bin per pixel of the frame. The area is typically scanned multiple times (i.e. with multiple passes) so as to reduce noise. As such, if the number of scans is not complete, then the process loops back to repeat steps 302 and 304. When the number of scans of the area have been completed, then the accumulated data in the single frame buffer is analyzed 306. The accumulation of the data for each pixel in a bin effectively averages the detected data from the multiple passes.

Figure 4:
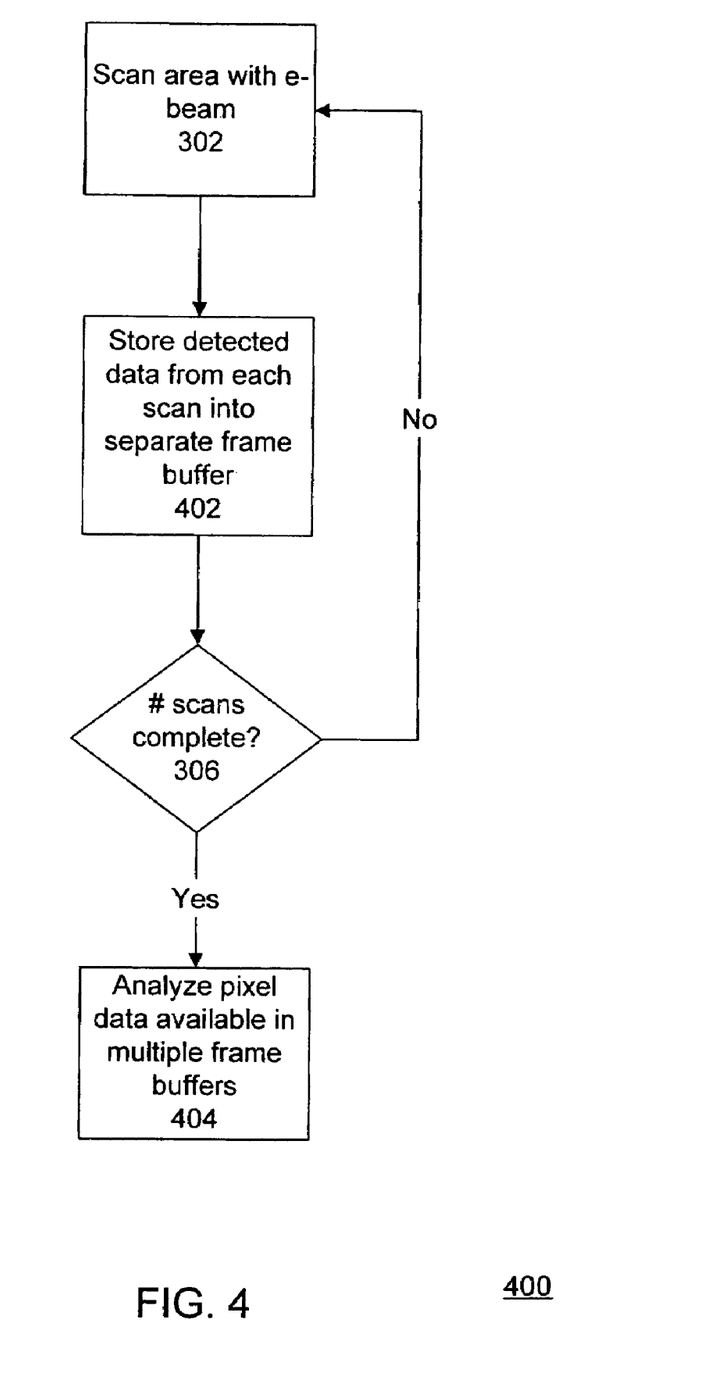
FIG. 4 is a flow chart depicting a method of operation for a scanning electron beam apparatus in accordance with an embodiment of the invention.

FIG. 4 is a flow chart depicting a method 400 of operation for a scanning electron beam apparatus in accordance with an embodiment of the invention. Like the conventional method 300, an area being imaged or analyzed is scanned 302 multiple times with an electron beam. However, data from detected secondary and/or backscattered electrons for each pixel is not accumulated in a single data bin. Rather, for each scan, the detected data for pixels in each scanned frame is stored in a separate frame buffer. If the number of scans is not complete, then the process loops back to repeat steps 302 and 402. When the number of scans of the area have been completed, then the pixel data available in the multiple frame buffers is analyzed 404. In this method 400, because the pixel data is stored separately 402 for each pass (instead of being accumulated), dynamic information is advantageously preserved for later analysis 404.

In alternate embodiments, there need not be a one-to-one correspondence between scans and frame buffers. For example, every two successive scans may be accumulated in a separate frame buffer, resulting in a two-to-one ratio between scans and frame buffers. More generally, every N successive scans may be accumulated in a separate frame buffer, resulting in an N-to-1 ratio. These embodiments also preserve dynamic information, but less than in the embodiment with the one-to-one ratio.

Figure 5:
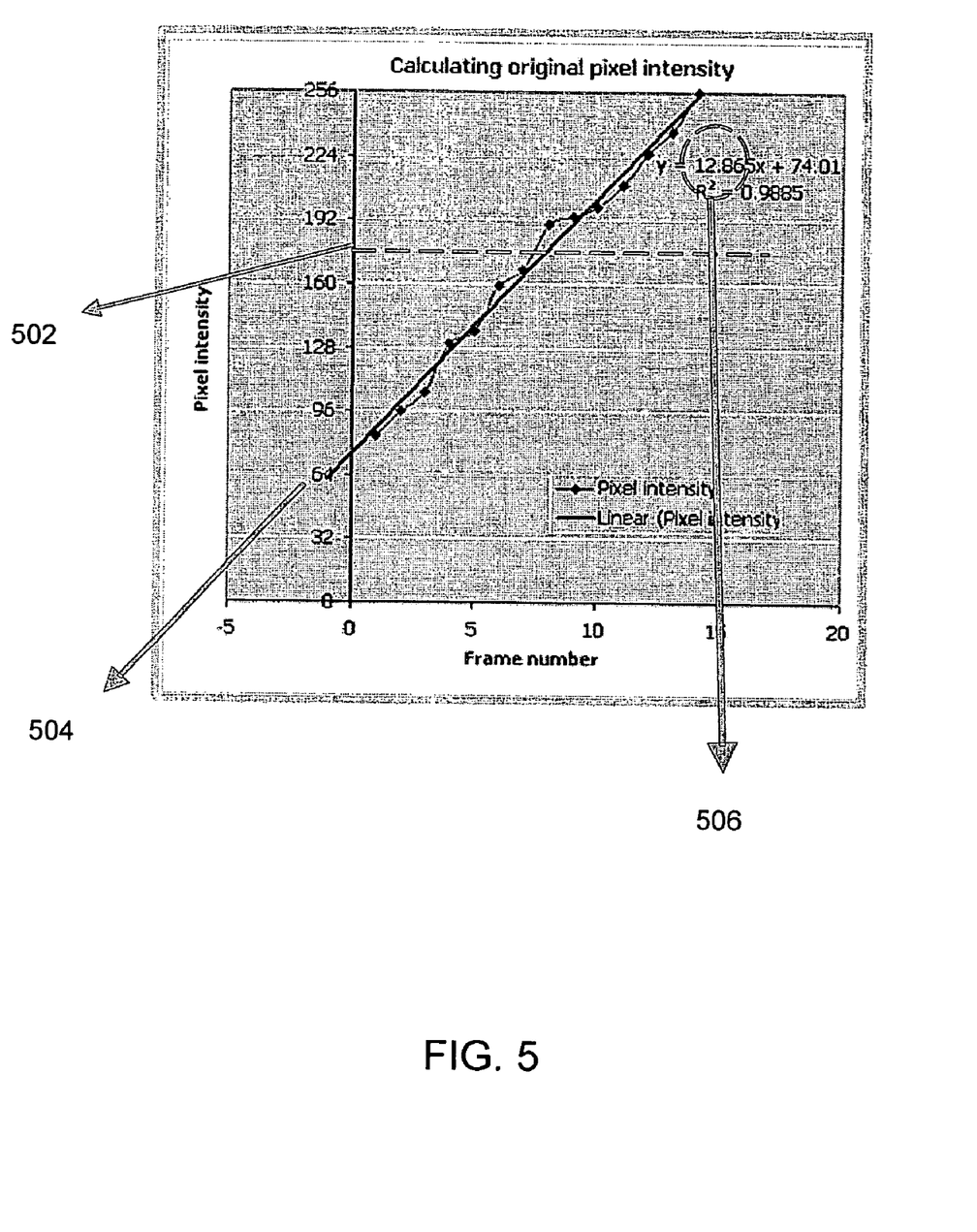
FIG. 5 is a graph showing pixel intensity versus frame number in accordance with an embodiment of the invention.

FIG. 5 is a graph showing pixel intensity versus frame number in accordance with an embodiment of the invention. Here, the intensity of a single pixel is shown to change with successive scans (i.e. increasing frame number). In this particular instance, the pixel intensity generally increases with frame number for the range shown.

Figure 6A:
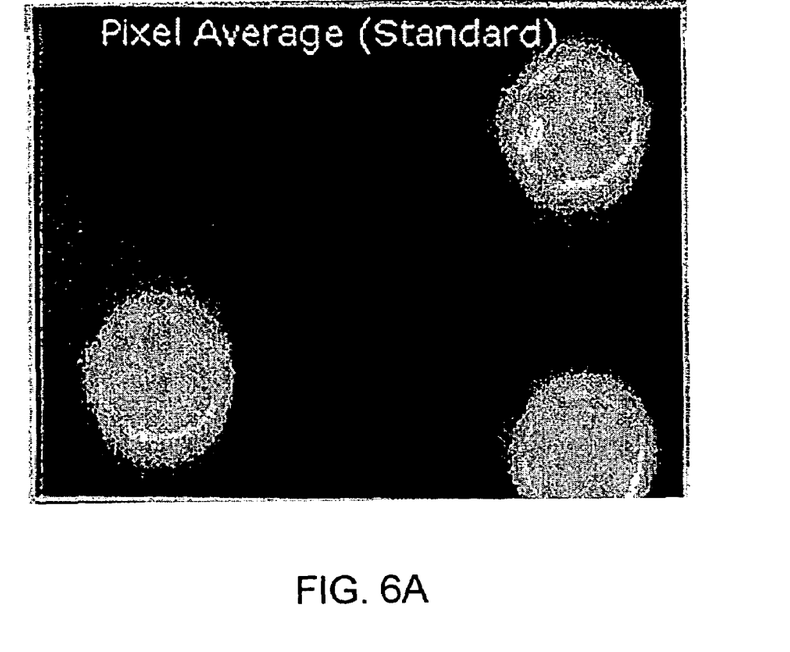
FIG. 6A depicts an image of averaged pixel data.

An average intensity level 502 for this pixel over the scans is shown. Using such average intensity levels for each pixel, "pixel average" image data may be obtained. An example of such an image is shown in FIG. 6A. This average image is analogous to the conventional images obtained by scanning electron microscopes that accumulate the data from multiple scans in a single frame buffer.

A function is fit to the pixel intensity versus frame number data. In this particular embodiment, a linear fit is performed. As shown in FIG. 5, the linear fit provides a y-axis intercept (i.e. frame "0" intercept) 504 and a slope 506.

Figure 6B:
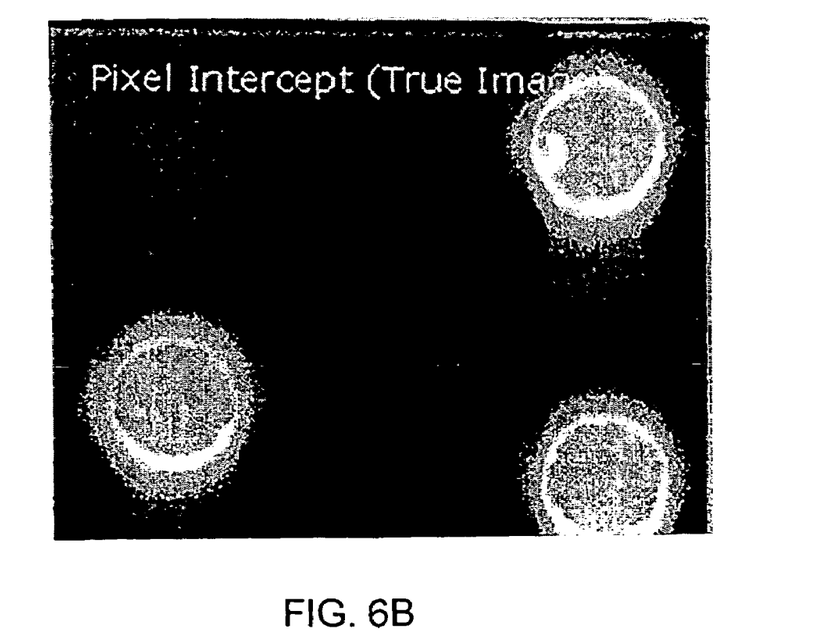
FIG. 6B depicts an image of pixel intercept data in accordance with an embodiment of the invention.

Using the intercept values for each pixel, "pixel intercept" image data may be obtained. An example of such an image is shown in FIG. 6B (from the same raw data as used to generate FIG. 6A). This intercept image may be considered to show a "true image" of the area in that it theoretically corresponds to image data generated without charging effects caused by the beam scan.

Figure 7:
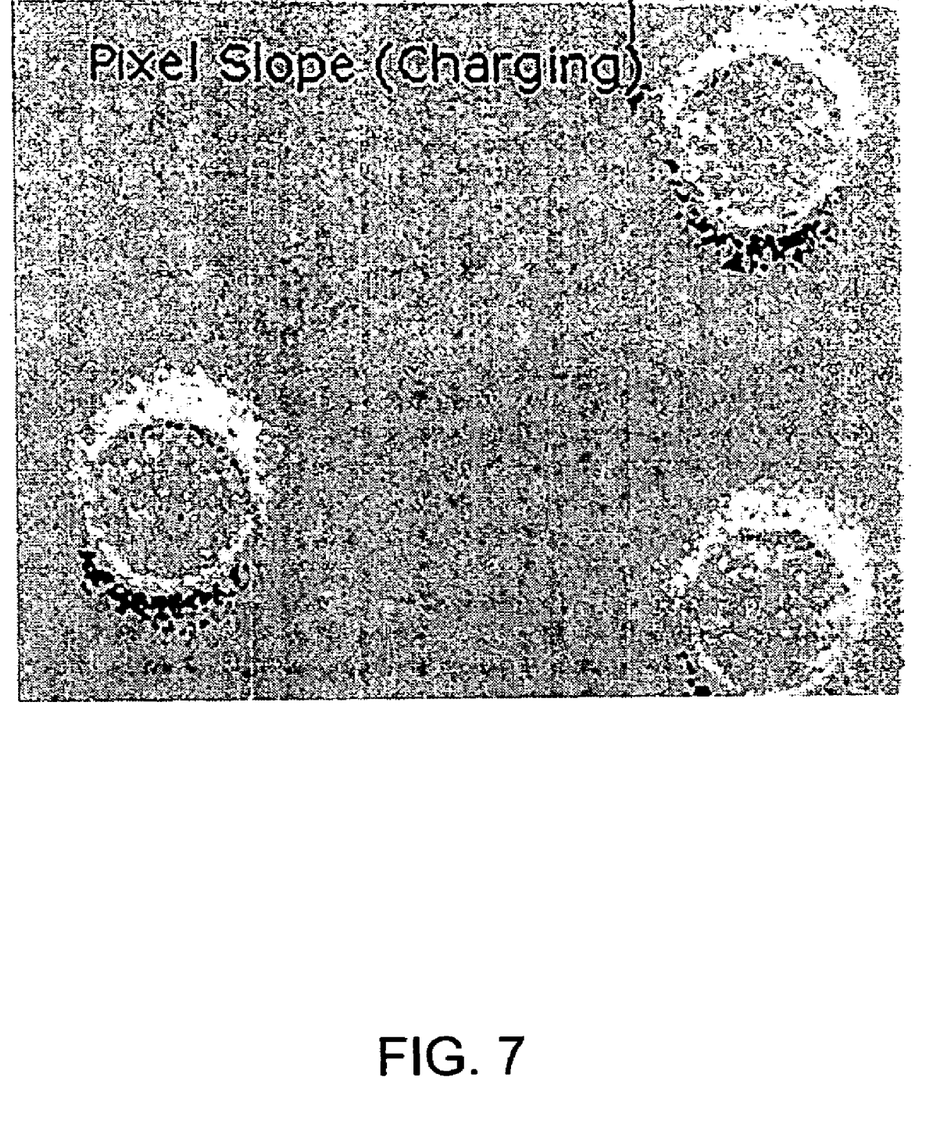
FIG. 7 depicts an image of pixel slope data in accordance with an embodiment of the invention.

Using the slope values for each pixel, "pixel slope" image data may be obtained. An example of such an image is shown in FIG. 7 (from the same raw data as used to generate FIGS. 6A and 6B). This slope image may be considered to depict charging characteristics of the area caused by the beam scans.

Figure 8:
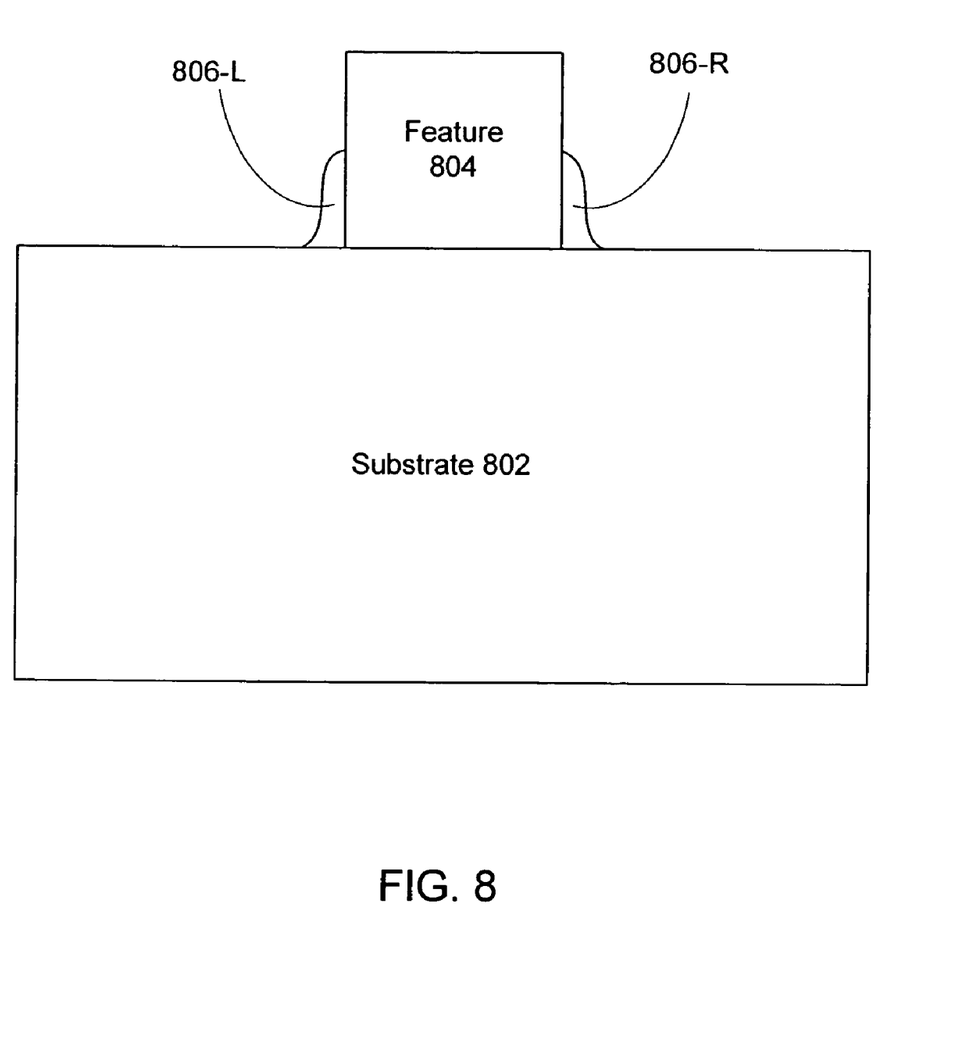
FIG. 8 is a cross-sectional diagram illustrating a feature with footings for purposes of discussion.

FIG. 8 is a cross-sectional diagram illustrating a feature 804 with footings 806 for purposes of discussion. The feature 804 may be formed on a substrate 802 during a semiconductor manufacturing process. The left 806-L and right 806-R footings or shoulders may be undesired artifacts of the process forming the feature 804. While the example feature illustrated corresponds to a line formed on a substrate, in other examples the feature may be a via or contact hole or other types of features.

Figure 9:
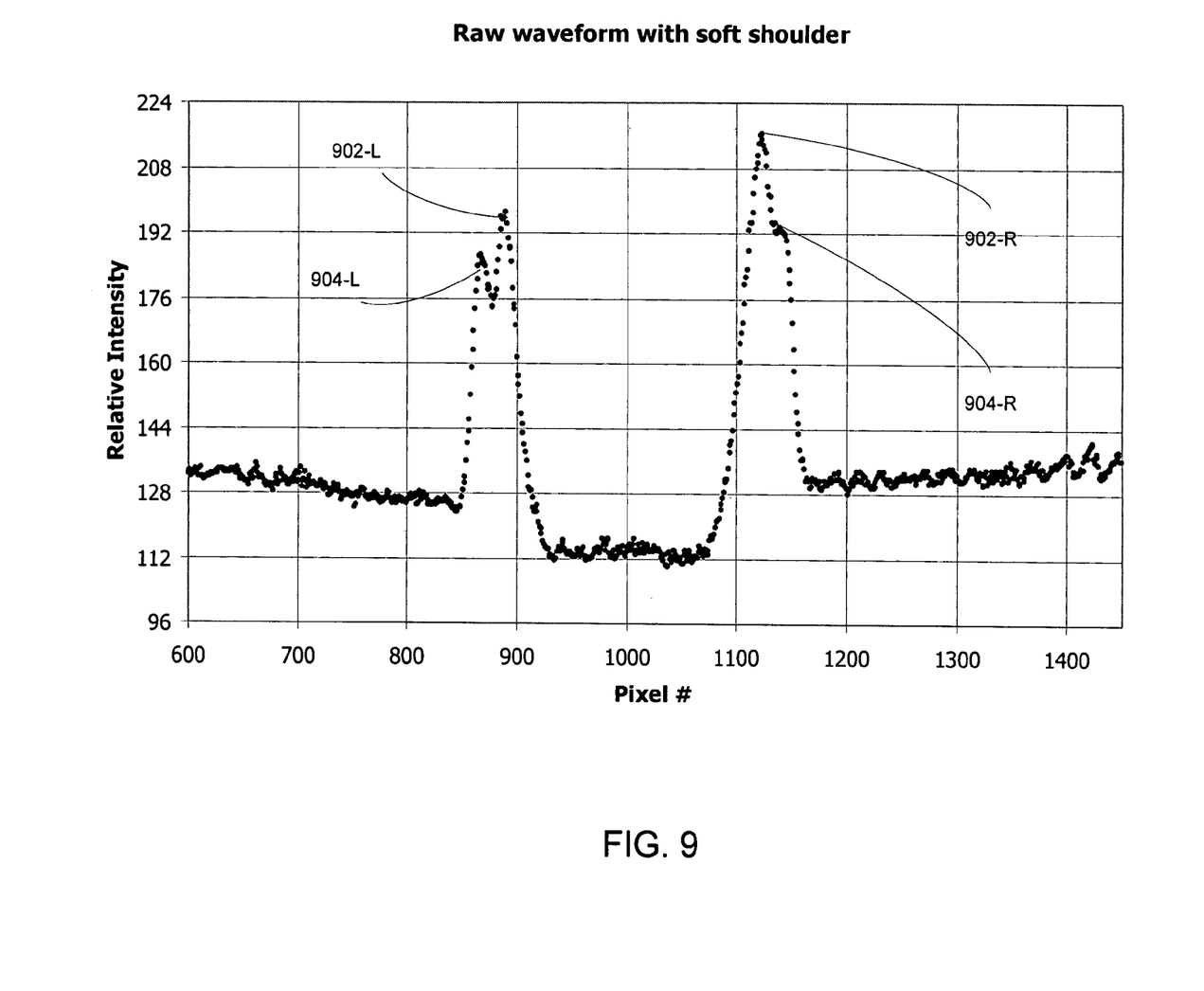
FIG. 9 is a graph showing relative intensity versus pixel number for a line scan across a critical dimension feature with a footing.

FIG. 9 is a graph showing relative intensity versus pixel number for a line scan across a critical dimension feature with footings on both sides. In this example, the main peaks 902 correspond to the left 902-L and right 902-R edges of the feature, and the side peaks or shoulders 904 in the data correspond to the left 904L and right 904-R footings or shoulders of the feature.

Figure 10:
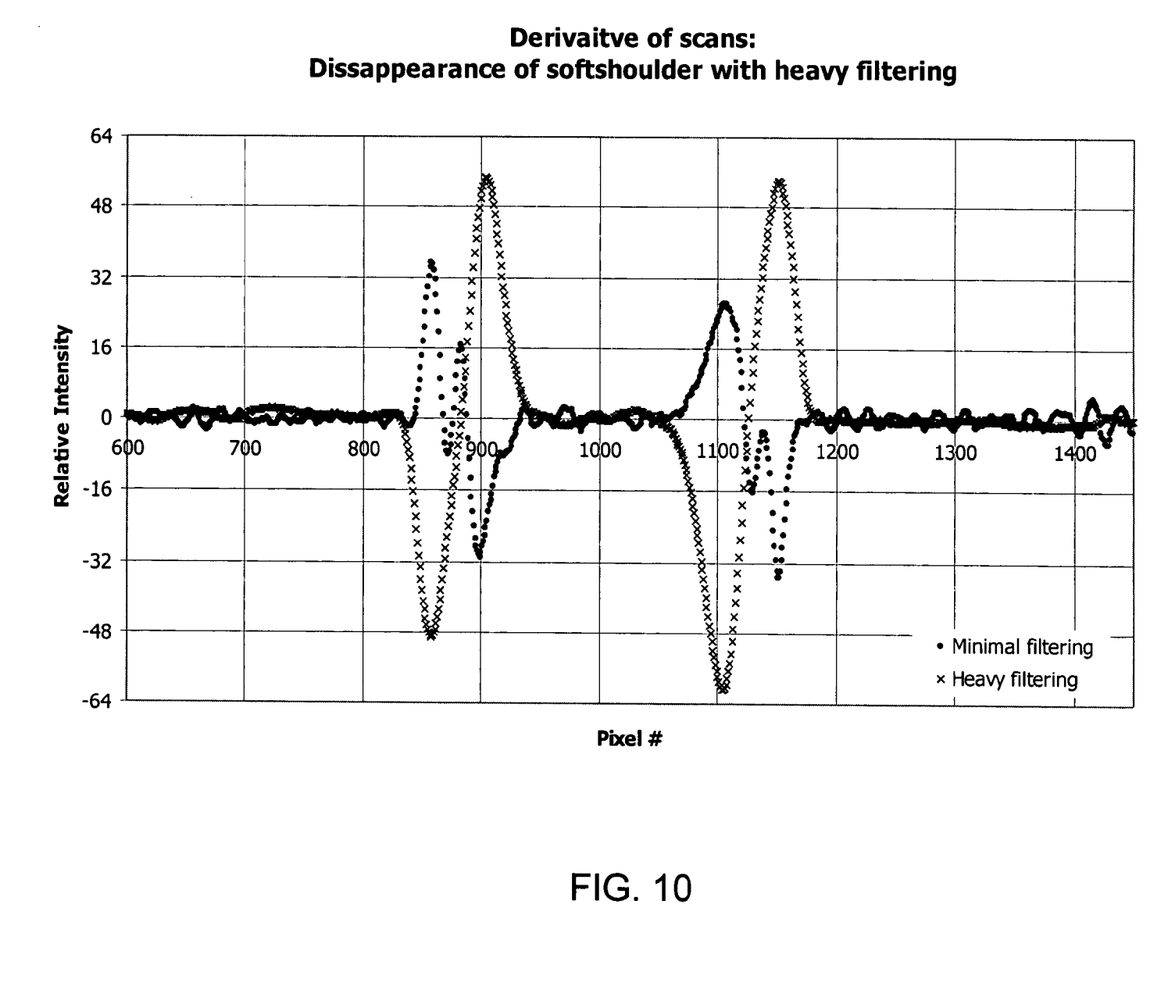
FIG. 10 is a graph showing derivatives of the line scan of FIG. 8 with minimal and heavy filtering.

FIG. 10 is a graph showing derivatives of the line scan of FIG. 8 with minimal and heavy filtering. As shown in FIG. 10, with minimal filtering the shoulders or side peaks are still visible in the derivative data. However, with heavy filtering, the shoulders or side peaks disappear. (Note that the heavy filtering data were inverted to allow superposition of the two data sets.)

Figure 11:
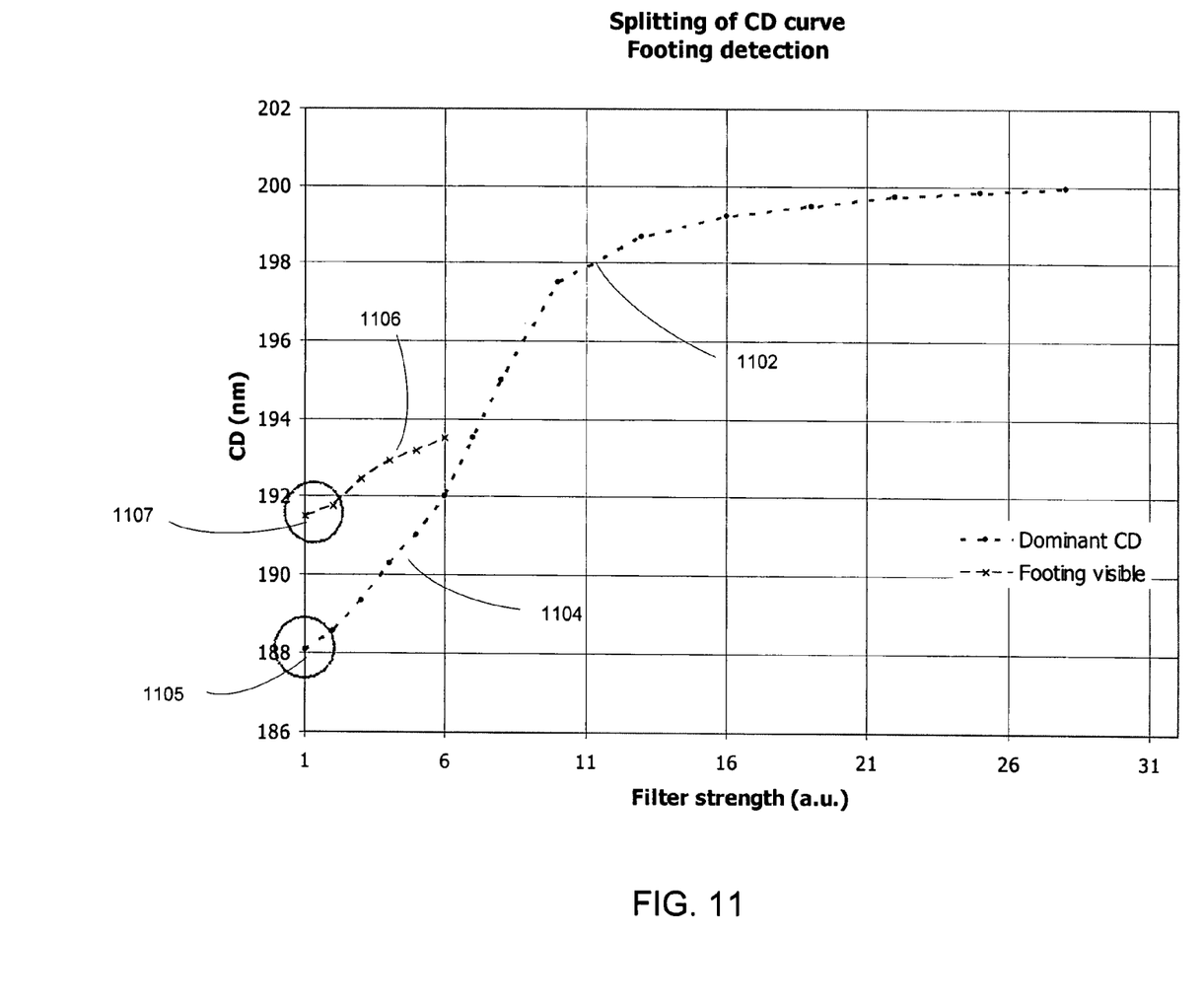
FIG. 11 is a graph showing critical dimension versus filter strength in accordance with an embodiment of the invention.

FIG. 11 is a graph showing critical dimension (in nanometers) versus filter strength (in arbitrary units) in accordance with an embodiment of the invention. At higher filter strengths, the critical dimension (CD) measurement is shown as a single data point per filter strength 1102 because the higher filter strengths causes smoothing over of the data such that shoulders or footings are no longer visible. At lower filter strengths, two CD data points are shown per filter strength. The lower CD data points 1104 correspond to CD measurements using the dominant peaks caused by the main edges of the feature. The upper CD data points 1106 correspond to CD measurements using the secondary or shoulder peaks caused by the footings or shoulders of the feature.

This technique provides CD measurement data at multiple filter strengths. This enables the generation of the depicted CD curve, including the splitting of the curve at lower filter strengths.

As shown in FIG. 11, this new processing technique advantageously enables the accurate determination of both a "dominant" or "main edges only" CD 1105 from the feature and a "footing visible" or "footing included" CD 1107. In this instance, the footing-included CD 1107 is larger than the dominant CD 1105. In another example, where a non-clean contact hole or via has footings on the bottom of it, the footing-included CD may be smaller than the dominant CD.

The above-described diagrams are not necessarily to scale and are intended be illustrative and not limiting to a particular implementation. In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. A method for processing data from a scanning electron beam apparatus, the method comprising:
   scanning an area of a specimen with an electron beam;
   storing detected pixel intensity data from the scan into a separate one of multiple frame buffers;
   repeating the scanning and the storing; and
   image analysis of the pixel intensity data as a function of a frame number, which designates one of the multiple frames in the frame buffer.

2. The method of claim 1, wherein the image analysis includes projecting the pixel intensity data to calculate pixel intensities at a hypothetical frame number zero so as to generate a pixel intercept image therefrom.

3. The method of claim 1, wherein the image analysis includes determining a rate of change of pixel intensity per successive frame so as to generate a pixel slope image therefrom.

4. A method for processing image data from a scanning electron beam apparatus, the method comprising:
   processing the image data as a function of pixel position with a filter function having a series of filter strengths; and
   measuring a critical dimension (CD) in the processed image data at each filter strength.

5. The method of claim 4, further comprising generating a critical dimension curve as a function of filter strength.

6. The method of claim 5, wherein the critical dimension curve includes a split therein into two curves.

7. The method of claim 6, wherein a first curve tracks a main edge measurement of the CD, and a second curve tracks a "footing included" measurement of the CD.

8. The method of claim 6, wherein a first curve tracks a dominant aspect of a feature of interest and a second curve tracks a combined aspect of the feature of interest.

9. The method of claim 8, wherein the feature of interest comprises a line formed on a semiconductor substrate, the dominant aspect comprises a main edge of the line, and the combined aspect comprises the main edge plus a shoulder of the line.

10. The method of claim 8, wherein the feature of interest comprises a hole formed on a semiconductor substrate, the dominant aspect comprises a main edge of the hole, and the combined aspect comprises the main edge plus footings in the hole.

11. A scanning electron beam apparatus, the apparatus comprising:
    an electron beam column configured to generate a primary electron beam;
    a scanning system configured to scan the electron beam over an area of a specimen;
    a detection system coordinated with the scanning system and configured to generate pixel data from each scan;
    circuitry configured to store detected pixel data from each scan into one of the multiple frame buffers; and
    a multi-frame data processor coupled to the multiple frame buffers and configured to analyze the pixel data as a function of frame number.

12. The apparatus of claim 11, wherein the analysis projects the pixel data to calculate pixel values at a frame number zero and generates a pixel intercept image from the calculated pixel values.

13. The apparatus of claim 11, wherein the analysis includes calculating a rate of change in pixel value per successive frame and generates a pixel slope image from the calculated rate of change in pixel value.

14. A scanning electron beam apparatus, the apparatus comprising:
    an electron beam column configured to generate a primary electron beam;
    a scanning system configured to scan the electron beam over an area of a specimen;
    a detection system coordinated with the scanning system and configured to generate pixel data from each scan; and
    a data processor coupled to the detection system,
    wherein the data processor is configured to process the image data as a function of pixel position with a filter function having a series of filter strengths, and to measure a critical dimension in the processed image data at each filter strength.

15. The apparatus of claim 14, wherein the data processor is further configured to generate a critical dimension curve as a function of filter strength.

16. The apparatus of claim 15, wherein the critical dimension curve includes a split therein into two curves.

17. The apparatus of claim 16, wherein a first curve tracks a main edge measurement of the critical dimension, and a second curve tracks a "footing included" measurement of the critical dimension.

18. The apparatus of claim 16, wherein a first curve tracks a dominant aspect of the critical dimension and a second curve tracks a combined aspect of the critical dimension.

* * * * *